(12) United States Patent
Roach

(10) Patent No.: US 7,103,487 B2
(45) Date of Patent: Sep. 5, 2006

(54) CIRCUITRY AND METHODS FOR CURRENT MEASUREMENTS REFERRED TO A PRECISION IMPEDANCE

(75) Inventor: Steven D. Roach, Colorado Springs, CO (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 11/176,553

(22) Filed: Jul. 6, 2005

(65) Prior Publication Data

US 2005/0261846 A1 Nov. 24, 2005

Related U.S. Application Data

(62) Division of application No. 10/015,972, filed on Nov. 1, 2001, now Pat. No. 6,944,556.

(51) Int. Cl.
*G01R 19/00* (2006.01)

(52) U.S. Cl. .................... 702/64; 702/57; 702/69; 702/81; 702/189; 323/312

(58) Field of Classification Search .................. None
See application file for complete search history.

(56) References Cited

U.S. PATENT DOCUMENTS

| | | | |
|---|---|---|---|
| 3,573,644 A | | 4/1971 | Evel |
| 4,227,127 A * | 10/1980 | Fukaya et al. ............ 388/821 |
| 4,853,610 A * | 8/1989 | Schade, Jr. ............... 323/316 |
| 4,893,030 A * | 1/1990 | Shearer et al. ............ 327/530 |
| 5,121,075 A | | 6/1992 | Roach |
| 5,367,248 A * | 11/1994 | Lin ........................... 323/312 |
| 5,418,488 A * | 5/1995 | Suquet ...................... 327/540 |
| 5,451,903 A * | 9/1995 | Armstrong ................ 330/263 |
| 5,495,184 A * | 2/1996 | Des Rosiers et al. ....... 326/73 |
| 5,687,330 A * | 11/1997 | Gist et al. .................. 710/305 |
| 5,705,953 A * | 1/1998 | Jesser ........................ 330/290 |
| 5,778,017 A * | 7/1998 | Sato et al. ............... 372/38.02 |
| 5,818,238 A * | 10/1998 | DeVilbiss ................. 324/537 |
| 5,818,292 A * | 10/1998 | Slemmer ................... 327/539 |
| 6,060,871 A * | 5/2000 | Barker ...................... 323/280 |
| 6,087,885 A * | 7/2000 | Tobita ....................... 327/379 |
| 6,118,266 A * | 9/2000 | Manohar et al. .......... 323/316 |
| 6,157,206 A * | 12/2000 | Taylor et al. ............... 326/30 |
| 6,236,584 B1 * | 5/2001 | Koo .......................... 363/143 |
| 6,424,200 B1 * | 7/2002 | McNitt et al. ............. 327/308 |
| 6,429,641 B1 * | 8/2002 | Montrose ............... 324/123 C |
| 6,518,833 B1 * | 2/2003 | Narendra et al. .......... 327/541 |
| 6,577,512 B1 * | 6/2003 | Tripathi et al. ............. 363/20 |
| 2002/0050827 A1 * | 5/2002 | Kronrod et al. ........... 324/642 |

(Continued)

OTHER PUBLICATIONS

Addis, John, "Three technologies on one chip make a broadband amplifier", *Electronics The International Magazine of Electronics Technology*, Jun. 5, 1972, pp. 103-107.

(Continued)

*Primary Examiner*—Carol S. W. Tsai
(74) *Attorney, Agent, or Firm*—Fish & Neave IP Group of Ropes & Gray LLP; Robert W. Morris; Jeffrey D. Mullen

(57) ABSTRACT

Circuitry and methods for obtaining accurate measurements of current supplied by an integrated circuit are provided. Current calculations are performed using information from a precision termination resistor and from the ratio relationship of two on-chip resistors. The invention provides a way to obtain accurate current measurements without the use of component trimming.

10 Claims, 2 Drawing Sheets

U.S. PATENT DOCUMENTS

2002/0149894 A1* 10/2002 Gregorius .................... 361/86
2002/0176262 A1* 11/2002 Tripathi et al. .......... 363/21.15
2003/0006747 A1*  1/2003 Jaussi et al. ................ 323/315

OTHER PUBLICATIONS

Ahuja, B. K., "Implementation of Active Distributed RC Anti-Aliasing/Smoothing Filters", *IEEE Journal of Solid-State Circuits*, vol. SC-17, No. 6, pp. 339-342.

Dascher, David J., "Measuring Parasitic Capacitance and Inductance Using TDR", *Hewlett-Packard Journal*, Apr. 1996, pp. 1-19.

Ikalainen, Pertti, K. "An RLC Matching Network and Application in 1-20 GHZ Monolithic Amplifier", *IEEE MTT-S International Microwave Symposium Digest*, vol. 1, 1989, pp. 1115-1118.

Khoury, John, M., "Synthesis of Arbitrary Rational Transfer Function is S Using Uniform Distributed RC Active Circuits", *IEEE Transactions on Circuits and Systems*, vol. 37, No. 4, Apr. 1990, pp. 464-472.

Khoury, John, M., "On the Design of Constant Setting Time AGC Circuits", *IEEE Transactions on Circuits and Systems*, vol. 45, No. 3, Mar. 1998, pp. 283-294.

MAXIM, "Interfacing Maxim Laser Drivers with Laser Diodes", May 2000, pp. 1-12.

Sackinger, Eduard, et al., "A 3GHz, 32dB CMOS Limiting Amplifier for SONET OC-48 Receivers", *IEEE International Solid-State Circuits Conference*, 2000, p. 158.

Swartz, R. G. et al., "An Integrated Circuit for Multiplexing and Driving Injection Lasers", *IEEE Journal of Solid-State Circuits*, vol. SC-17, No. 4, Aug. 1982, pp. 753-760.

AMCO Product Brief 1.0/1.25GBPSVCSELDRIVER, May 10, 1999, pp. 1-3.

SUMMIT Microelectronics, Inc. "Dual Loop Laser Diode Adaptive Power Controller with Look Up Table" (SML2108), Oct. 3, 2001, pp. 1-21.

\* cited by examiner

CIRCUITRY AND METHODS FOR CURRENT MEASUREMENTS REFERRED TO A PRECISION IMPEDANCE

CROSS REFERENCE TO RELATED APPLICATION

This is a divisional of commonly-assigned, U.S. patent application Ser. No. 10/015,972 filed Nov. 1, 2001 now U.S. Pat. No. 6,944,556.

BACKGROUND OF THE INVENTION

This invention relates to driver circuitry. More particularly, this invention relates to driver circuitry that performs current measurements using a precision external resistor.

In the past, the semiconductor industry has utilized various configurations of "driver circuitry" for supplying power to loads that are external to an integrated circuit. Common examples of such external loads include transmission lines, communication systems, electric motors, and illumination systems. One characteristic of driver circuitry that is of interest to system designers is the amount of current the driver circuitry actually supplies to the external load. In certain applications, such as those involving power transmission or lighting systems, it is not necessary for the driver circuitry to obtain precise values of the supplied current. Other applications, however, such as communications systems, often rely on precise bias and modulation current measurements to properly function. Previously, precision current measurements have been made possible by "trimming" on-chip resistors and voltage references to obtain tolerance values suitable for current sensing. This method, however, is costly and time consuming.

In light of the foregoing, it would therefore be desirable to provide circuits and methods for accurately calculating the current supplied by driver circuitry without resorting to costly and time consuming trimming techniques.

SUMMARY OF THE INVENTION

It is therefore an object of the present invention to provide circuits and methods for precisely calculating the current supplied by driver circuitry without resorting to costly and time consuming resistor trimming techniques.

This and other objects are accomplished in accordance with the principles of the present invention by providing circuits and methods for precisely calculating the current supplied by driver circuitry without resorting to costly and time consuming resistor trimming techniques. Current calculations are performed using information from a precision termination resistor and from the ratio relationship of two on-chip resistors. The invention provides a way to obtain accurate current measurements without the use of component trimming.

BRIEF DESCRIPTION OF THE DRAWINGS

The above and other objects and advantages of the present invention will be apparent upon consideration of the following detailed description, taken in conjunction with the accompanying drawings, in which like reference characters refer to like parts throughout, and in which.

DETAILED DESCRIPTION OF THE INVENTION

Figure 1:
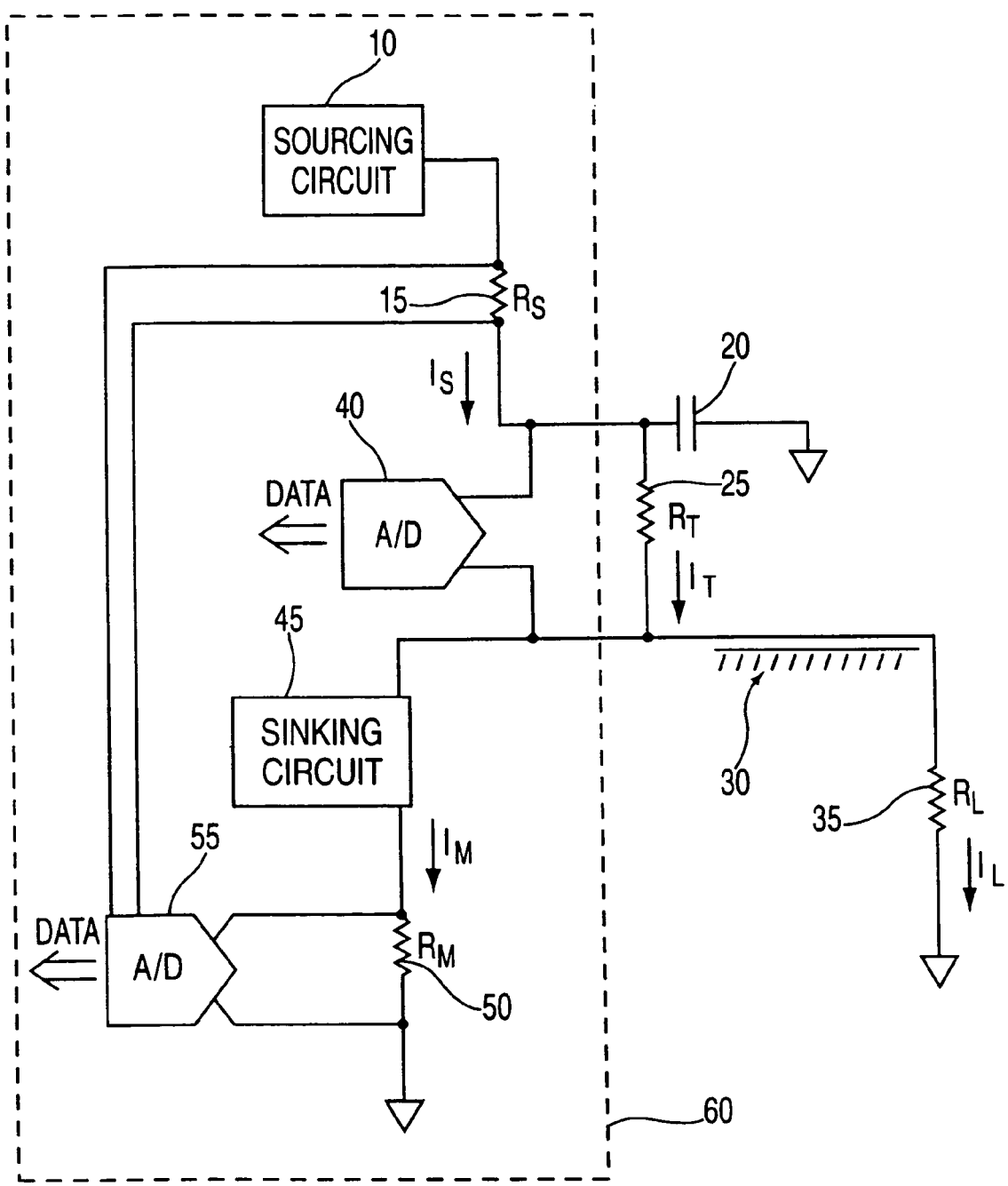
FIG. 1 is a schematic diagram of a driver circuit constructed in accordance with the principles of the present invention.

FIG. 1 is an illustrative block diagram of a driver circuit 100 constructed in accordance with the principles of the present invention that can be used to obtain accurate measurements of supplied current. Driver circuit 100 includes a sourcing circuit 10, a sense resistor 15, an external termination resistor 25, analog to digital converters 40 and 55, a sinking circuit 45, and a modulation resistor 50.

Transmission line 30 and load 35 represent the external load driven by circuit 100. Capacitor 20 may also be included in circuit 100, if desired. Although other arrangements are possible, the components within dotted line 60 are typically constructed on an integrated circuit device.

As shown in FIG. 1, sourcing circuit 10 provides a substantially constant source current ($I_S$) to sense resistor 15, termination resistor 25, and load 35 (through transmission line 30). Sourcing circuit 10 may be any circuit configuration suitable for providing a substantially constant current such as current mirror type bias circuitry.

The current supplied to load 35 may be varied by periodically switching sinking circuit 45 ON and OFF, allowing a modulation current ($I_M$) to pass through it during an ON state, and acting as an open circuit during an OFF state. In some embodiments, sinking circuit 45 may be configured to turn ON and OFF partially to improve response time. Sinking circuit 45 may include any circuitry suitable for switching between ON and OFF states such as a transistor or armature type switch.

The value of modulation resistor 50 affects the operation of circuit 100 when sinking circuit 45 is switched ON. For example, when sinking circuit 45 turns ON and current flows across modulation resistor 50, the amount of current supplied to load 35 decreases in proportion to the resulting current divider network. Thus, if modulation resistor 50 has a value significantly less than load 35, the amount of current supplied to load 35 ($I_L$) decreases significantly. On the other hand, if the value of modulation resistor 50 is much greater than load 35 (i.e., a factor of 10 or more), load current $I_L$ will only decrease somewhat. Thus, a circuit designer may select an approximate value for modulation resistor 50 with respect to load 35 to control the current differential applied across it. This allows circuit designers to define the range of current values supplied by circuit 100, such as those associated with the transmission of logic "high" or a logic "low," signal to load 35.

Driver circuit 100 will operate without termination resistor 25. However, because transmission line 30 typically has a characteristic impedance similar to, but not perfectly matched with load 35, a portion of the transmitted signal is reflected back to the driver circuit, causing signal distortion. This problem may be corrected, however, by the addition of termination resistor 25 and capacitor 20, which allows current flow when the line voltage changes. These components help to absorb the reflected energy from load 35 so that high speed current cannot circulate back into the load. The present invention takes advantage of the fact that termination resistor 25 typically has significantly higher tolerance level than those found on an integrated circuit, usually around ±1%, which can be used to obtain accurate current measurements.

Measurement of source current $I_S$ and modulation current $I_M$ is performed using analog-to-digital converters (A/D converters) 40 and 55. This is accomplished by measuring the voltage drop across termination resistor 25, source resistor 15, and modulation resistor 50. The voltage drop across resistor 50 is divided by the voltage drop across resistor 15 and the voltage drop across termination resistor 25 divided by a reference voltage (not shown). These operations produce discrete values. In FIG. 1, these discrete values are depicted as 'data' outputs that are sent from A/D converters 40 and 55 to computational circuitry or software (not shown) that performs the mathematical operations necessary to determine the modulation current $I_M$ and source current $I_S$ (discussed in more detail below) Such circuitry may include, but is not limited to, a multiplication amplifier, a microprocessor, a programmable logic array, etc.

To calculate modulation current $I_M$, the value of source current $I_S$ must be known. Generally speaking, source current $I_S$ is substantially equal to the current across termination resistor 25 ($I_T$) when no current flows through capacitor 20. Current will only flow through capacitor 20 when the voltage across it changes. Because this occurs only for a very short duration at the instant sourcing circuit 45 switches from ON to OFF (and vice versa), an accurate measurement of source current $I_S$ may be obtained by measuring the voltage drop across precision termination resistor 25.

A measurement of the termination voltage (i.e, the voltage drop across termination resistor 25) may be used as a first step in determining the value of source current $I_S$. For example, during operation, A/D converter 40 may take an analog voltage measurement of the termination voltage with respect to a reference voltage (not shown). This measurement, which is represented as $X_{TR}$, is the termination voltage divided by the reference voltage. Accordingly, the variable $X_{TR}$ is a dimensionless ratio of these two voltages, having a value between 1 and 0 such that:

$$X_{TR}=V_T/V_{REF} \quad (1)$$

Furthermore, it will be appreciated that the termination voltage is equal to the product of the termination current ($I_T$) and the termination resistance ($R_T$). Substituting this relationship into equation (1) gives the following:

$$X_{TR}=(I_T*R_T)/V_{REF} \quad (2)$$

Because source current $I_S$ is equivalent to termination current $I_T$, equation (2) may be re-written as:

$$X_{TR}=(I_S*R_T)/V_{REF} \quad (3)$$

Solving equation (3) for source current $I_S$ gives the following:

$$I_S=I_T=X_{TR}*V_{REF}/R_T \quad (4)$$

Thus, as demonstrated above, circuit 100 may calculate the sourcing current $I_S$ as a function of precision termination resistor 25. In some embodiments of the present invention, equation 4 may be solved by an external computing device. The input to such a device is obtained from A/D converter 40.

It will be appreciated from the above that the accuracy of the sourcing current calculation is dependent only upon precision termination resistor 25 and an untrimmed internal voltage reference (not shown). Typically, these circuit components have tolerances of ±1% and ±5%, respectively. Thus, using the following well-known statistical error equation:

$$E=\sqrt{X^2+Y^2} \quad (5)$$

where X represents the tolerance of termination resistor 25, and Y represents the tolerance of the voltage reference, it can be seen the accuracy of the source current measurement is approximately ±5%. This is a dramatic improvement over conventional systems that rely on measurements based on an untrimmed voltage reference and an untrimmed sense resistor 15. Because these components typically have tolerances of ±5% and ±20%, respectively, the overall accuracy of sourcing current measurements is approximately ±20%. Thus, the present invention provides sourcing current measurements that are at least four times more accurate than those provided by conventional systems.

The next step in calculating modulation current $I_M$ is to measure the voltage drop across modulation resistor 50 and compare it to the voltage drop across sensing resistor 15. A/D converter 55 accomplishes this and obtains a value for $X_{MS}$, which is defined by the following:

$$X_{MS}=V_M/V_S \quad (6)$$

where $V_M$ is the voltage across modulation resistor 50 and $V_S$ is the voltage across sensing resistor 15. According to Ohm's Law, each of these voltages are equal to the product of their respective current and resistance. Therefore:

$$V_M=I_M*R_M; \quad (7)$$

and $$V_S=I_S*R_S \quad (8)$$

Substituting equations 7 and 8 into equation 6 yields:

$$X_{MS}=(I_M*R_M)/(I_S*R_S) \quad (9)$$

Solving equation 9 for modulation current $I_M$ results in the following relationship:

$$I_M=(X_{MS})*(R_S/R_M)*(I_S) \quad (10)$$

To solve equation 10, a value of $I_S$ must be obtained. By substituting equation 4 into equation 10, the following expression is derived:

$$I_M=(X_{MS}*R_S/R_M)*(X_{TR}*V_{REF}/R_T) \quad (11)$$

rearranging equation 11 to group like terms, the following is obtained:

$$I_M=(X_{MS}*X_{TR})(R_S/R_M)(V_{REF}/R_T) \quad (12)$$

Thus, it can be seen from equation 12, that the measurement of modulation current $I_M$ depends only on the reference voltage ($V_{REF}$), termination resistor 25, and the ratio of modulation resistor 50 to sensing resistor 15. Because existing integrated circuit fabrication techniques permit the variance of the resistor ratio to be less than ±1%, the overall accuracy of the modulation current calculation remains approximately ±5%, without the use of trimming. This is a significant improvement over conventional measurement techniques which yield an overall accuracy of about ±20%.

Although driver circuit 100 may be used in a wide variety of applications that involve signal modulation, it is particularly useful for light-based modulation systems. In an optical communication system, for example, it is often necessary to quickly toggle a light source, such as a laser diode, to produce light pulses that are used as communication signals. To do this efficiently, circuit designers usually bias the light source such that it varies between two precise levels. One of the levels represents an optical "logic low," during which a minimum optical signal is produced. The other level represents an optical "logic high" which produces an optical signal of sufficient strength to be differentiated from an optical "logic low" signal. The shorter this dynamic range is, the faster the light source can be varied between a "logic low" and a "logic high." By having accurate measurements of bias and modulation currents, the driver circuitry can determine and optimize the extinction ratio (i.e., the amount of optical power need to produce a logic "high" signal compared to the optical power needed to produce a logic "low") of the light source.

Accurately determining the operating currents and extinction ratio of circuit 100 has many advantages. For example, the average current required to maintain a constant average optical output power provides a good indication of the operational condition of the light source. For example, the turn ON threshold of a laser diode tends to degrade over time. By monitoring the average laser current, a communications system may accurately predict the imminent failure of the light source and provide a warning about impending failure so replacement can be made without loss of service.

Moreover, accurate measurements of the modulation and bias currents are useful for statistical process control during the final assembly of laser transceiver modules, where accurate measurement of laser setup conditions may give an early indication of manufacturing problems.

Figure 2:
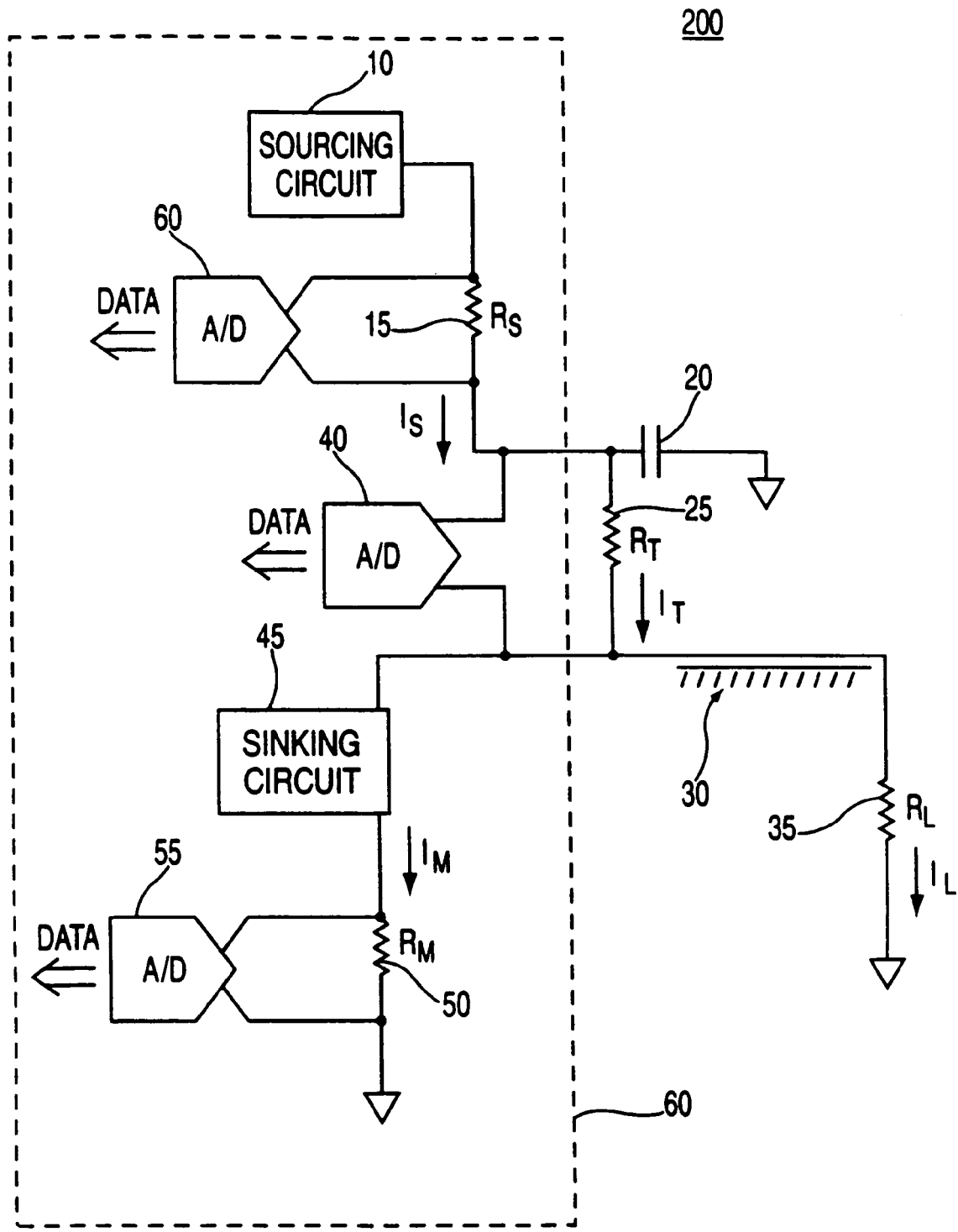
FIG. 2 is a schematic diagram of another driver circuit constructed in accordance with the principles of the present invention.

Another embodiment of the present invention may be used to calculate the modulation current $I_M$ that also yields an overall accuracy of ±5%. This approach is illustrated in FIG. 2 as driver circuit 200 which is similar to driver circuit 100 with the exception that circuit 200 employs a third A/D converter 60. A/D converter 60 measures the voltage drop across sensing resistor 15 with respect to a reference voltage (not shown) and generates a value represented as $X_{SR}$. A/D converter 55 no longer uses the voltage across sensing resistor 15 as a reference. Next, A/D converter 40 operates as described above and determines $X_{TR}$. A/D converter 55 then determines $X_{MR}$, instead of $X_{MS}$, where $X_{MR}$ is the voltage drop across modulation resistor 50 measured with respect to a reference voltage (not shown) so that:

$$X_{MR} = V_M/V_{REF} \quad (13)$$

Using Ohm's law it can be shown that:

$$X_{MR} = I_M * R_M/V_{REF} \quad (14)$$

Solving for $I_M$ yields:

$$I_M = X_{MR} * V_{REF}/R_M \quad (15)$$

$X_{SR}$ may be obtained with A/D converter 60 and expressed using the following relationship:

$$X_{SR} = I_S * R_S/V_{REF} \quad (16)$$

Combining equations 3, 14, and 16 and rearranging gives the following:

$$I_M = X_{MR} * (X_{TR}/X_{SR}) * (R_S/R_M) * (V_{REF})/R_T \quad (17)$$

Thus, it can be seen from equation 17, that the measurement of modulation current $I_M$ depends only on the reference voltage ($V_{REF}$), termination resistor 25, and the ratio of modulation resistor 50 to sensing resistor 15. The readings obtained from A/D converters 40, 55, and 60 may then be sent to processing circuitry to perform the calculations as described above (not shown). Bias and modulation current information may be used to compute feedback information and the extinction ratio. These values may also be used internally by the driver circuit or externally for statistical analysis.

Persons skilled in the art will recognize that the present invention may be implemented using a variety of circuit configurations other than those shown and discussed above. For example, the present invention may employ some trimming on the internal reference voltage to improve its accuracy (e.g., to about ±1%). This further improves the accuracy of current measurements.

Moreover, termination resistor 25 need not be external to the integrated circuit, rather it may be fabricated on the integrated circuit and trimmed to the appropriate value. Furthermore, sinking circuit 45 may be replaced by or used in conjunction with a signal source that periodically impedes and allows current flow, thus providing modulation.

The present invention may also use data collecting components other than the A/D converters depicted in FIGS. 1 and 2 to implement different embodiments of the present invention. In addition, it will be appreciated that some or all of the resistors shown may be replaced by elements such as synthetic circuit components with impedances having a reactive component rather than elements with purely resistive attributes (e.g., a switched capacitor circuit). All such modifications will be recognized as within the scope of the present invention, which is limited only by the claims that follow.

What is claimed is:

1. A circuit that determines a current supplied by an integrated circuit comprising:
    a sensing impedance disposed on the integrated circuit;
    a modulation impedance;
    a first measurement device coupled to the sensing impedance configured to measure a voltage drop across the sensing impedance;
    a second measurement device coupled to the modulation impedance configured to measure voltage drop across the modulation impedance;
    a termination impedance;
    a third measurement device coupled to the termination impedance configured to measure a voltage drop across the termination impedance; and
    processing circuitry configured to receive information from the first, second, and third measurement devices and calculate supplied current therefrom.

2. The circuit of claim 1 wherein the first measurement device is an analog to digital converter.

3. The circuit of claim 1 wherein the second measurement device is an analog to digital converter.

4. The circuit of claim 1 wherein the third measurement device is an analog to digital converter.

5. The circuit of claim 1 wherein the second analog to digital converter further comprises a trimmed voltage reference.

6. The circuit of claim 1 wherein the termination impedance is a precision resistor.

7. The circuit of claim 1 wherein the termination impedance is a switched capacitor circuit.

8. The circuit of claim 6 wherein the termination impedance is an external resistor.

9. The circuit of claim 1 further comprising a sinking circuit coupled to the modulation impedance.

10. The circuit of claim 1 wherein the supplied current is a modulation current.

* * * * *